United States Patent [19]
Vijeh et al.

[11] Patent Number: 5,315,590
[45] Date of Patent: May 24, 1994

[54] SELECTABLE REPEATER PORT RECONNECTION METHOD AND APPARATUS

[75] Inventors: Nader Vijeh, Cupertino; David Staab, San Jose, both of Calif.

[73] Assignee: Advanced Micro Devices Inc., Sunnyvale, Calif.

[21] Appl. No.: 594,929

[22] Filed: Oct. 10, 1990

Related U.S. Application Data

[63] Continuation-in-part of Ser. No. 556,046, Jul. 20, 1990, Pat. No. 5,265,123, and a continuation-in-part of Ser. No. 480,426, Feb. 15, 1990, Pat. No. 5,164,960.

[51] Int. Cl.$^5$ .............................. H04B 3/36
[52] U.S. Cl. ...................................... 370/79
[58] Field of Search ................. 370/85.13, 13, 75, 35, 370/97, 85.1, 94.1, 55; 375/314; 455/7, 14, 15, 16; 340/825.5

[56] References Cited

U.S. PATENT DOCUMENTS

| | | | |
|---|---|---|---|
| 4,380,761 | 4/1983 | Boggs | 370/85.2 |
| 4,825,435 | 4/1989 | Amundsen et al. | 370/85.1 |
| 4,945,532 | 7/1990 | Hald | 370/13 |
| 5,048,009 | 9/1991 | Conrad | 370/13 |

FOREIGN PATENT DOCUMENTS 0222669  5/1987  European Pat. Off. .

OTHER PUBLICATIONS

R. Shani, "Fiber Optic IEEE 802.3 CSMA/CD Networks" Proceedings of the Ninth International Conference on Computer Communication, pp. 408–414 (Nov. 1988).

Primary Examiner—Douglas W. Olms
Assistant Examiner—Dang Ton
Attorney, Agent, or Firm—Townsend and Townsend Khourie and Crew

[57] ABSTRACT

An apparatus and method for providing a selectable novel reconnection algorithm for a repeater partition state machine to use in reconnecting a partitioned port. The reconnection algorithm permits selection of one of a first or a second partitioning/reconnection algorithm from a set of partitioning/reconnection algorithms. The first partitioning/reconnection algorithm corresponds to the IEEE 802.3 Standard partitioning/reconnection algorithm. The second partitioning/reconnection algorithm reconnects a partitioned port only upon minimum duration collision-free transmit activity from a partitioned port. The apparatus includes a partition state machine responsive to a counter controlled by a signal indicating the particular partitioning/reconnection algorithm selected and a device for selecting the algorithm. The signal determines whether the counter responds to receive and transmit activity or only to transmit activity. When the counter times that the minimum duration of the appropriate activity has elapsed and the partition state machine has seen activity without a collision, the port is reconnected as appropriate.

9 Claims, 19 Drawing Sheets

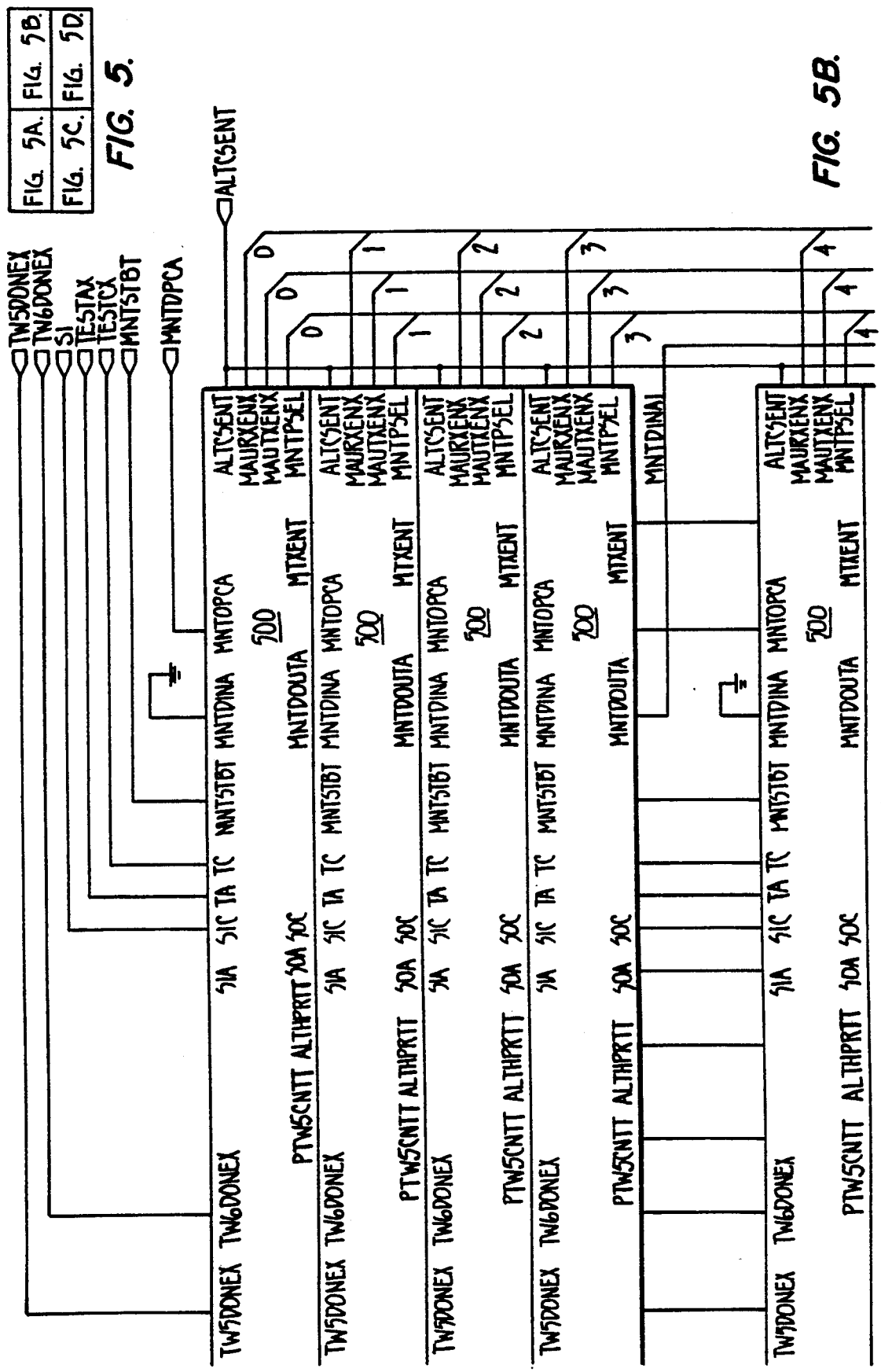

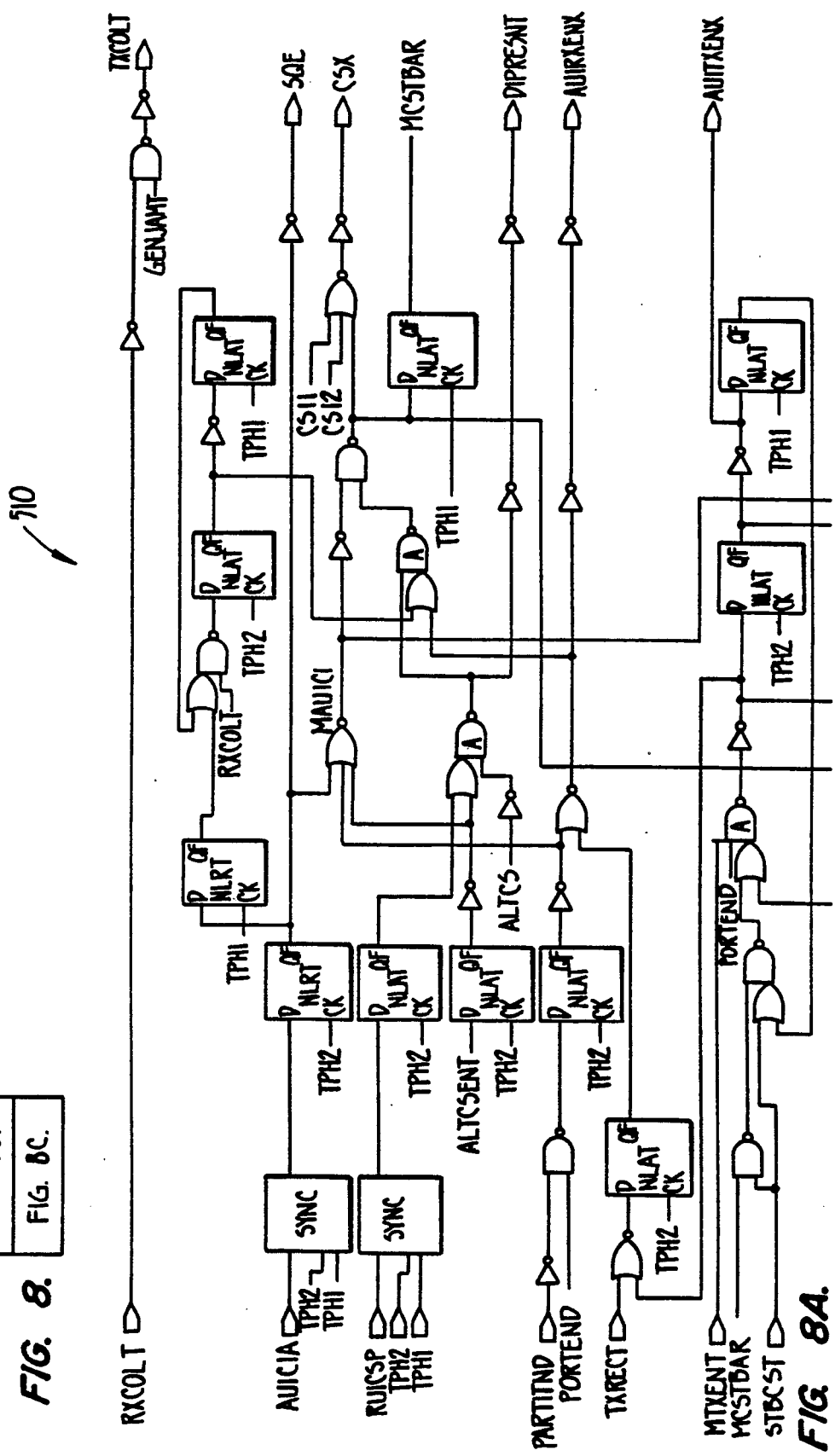

SELECTABLE REPEATER PORT RECONNECTION METHOD AND APPARATUS

This application is a continuation-in-part of Ser. No. 556,046, filed Jul. 20, 1990, now U.S. Pat. No. 5,265,123, and a continuation-in-part of Ser. No. 480,426, filed Feb. 15, 1990, now U.S. Pat. No. 5,164,960. These appliccations are expressly incorporated by reference for all purposes.

BACKGROUND OF THE INVENTION

This invention relates to a method for reconnecting partitioned ports in a network. Specifically, the invention relates to a method for reconnecting partitioned ports of a repeater that is part of a network constructed with twisted pair wiring.

Repeaters conforming to IEEE 802.3 Standard, hereby expressly incorporated by reference for all purposes, partition ports that have excessive collision activity. The IEEE 802.3 Standard defines a collision as simultaneous receive and transmits activity at a single port. The IEEE 802.3 Standard also defines a port with excessive collision activity as a port that participates in each collision of a preceding set of 32 consecutive collisions. Excessive collision activity also includes a prolonged collision for a particular port.

A partition state machine partitions ports which have excessive collision activity. A partitioned port can receive transmissions, but the repeater does not relay any incoming data packets from partitioned ports. The partition state machine continues monitoring partitioned ports to determine whether it should reconnect these ports.

The IEEE 802.3 Standard defines a partitioning/reconnection algorithm which requires reconnection of a partitioned port upon collision-free transmissions or receptions relative to the port lasting a predefined minimum period. A term "port activity" defines transmission or reception at a port. Thus, the standard algorithm reconnects a partitioned port upon collision-free port activity. The IEEE 802.3 Standard sets the minimum period at or about 512 bit times.

This partitioning/reconnection algorithm may cause problems when used with repeaters that are part of a network conforming to the IEEE 10 BASE-T Standard. The 10 BASE-T Draft 10 Standard implements a network by use of twisted pair wiring, and is expressly incorporated by reference for all purposes. Networks carried out with twisted pair wiring are susceptible to installation difficulties resulting in network performance degradation due to use of inappropriate cabling. A particular port's transmit wires may not be properly terminated or the network may use untwisted wiring. In either case, transmissions from that port can produce cross-talk on the associated receive wiring of the port, thereby creating a collision. The repeater thereafter detects a collision every time the repeater tries to transmit to a node connected to such a port. The partitioning system properly partitions such a port. Unfortunately, the IEEE 802.3 Standard reconnection algorithm reconnects upon a partitioned port a minimum time duration collision-free reception at the port. The wiring problem on the transmission side of the port does not affect the reception. In this case, the partition state machine will reconnect the partitioned port after each partition, allowing later transmissions to cause collisions. This cycle degrades the performance of the network.

SUMMARY OF THE INVENTION

The present invention provides a method and apparatus for reconnecting a partitioned port by use of an alternate selectable partitioning/reconnection algorithm which permits reconnection only upon minimum period collision-free transmission from a partitioned port. The invention is particularly useful in networks which use twisted pair wiring.

According to one aspect of the invention, it includes a repeater having a plurality of ports, a partition state machine and a management port. The partition state machine implements the IEEE 802.3 Standard partition state machine and includes an additional enhancement option to implement an alternate algorithm. The alternate algorithm allows for a more robust system as a user may control the reconnection algorithm to protect the network from some wiring problems. The alternate algorithm reconnects a port partitioned by the partition state machine only upon collision-free transmission for a minimum period.

Reference to the remaining portions of the specification and the figures realize a further understanding of the nature and advantages of the present invention.

BRIEF DESCRIPTION OF THE DRAWING

FIGS. 5(A)–5(D) are a schematic block diagram of the STATUS 304 of FIGS. 4 and 4(A)–4(C);

FIGS. 8 and 8(A)–8(C) are a circuit diagram of the AUICSDET 510 of FIGS. 6 and 6(A)–6(B)

DETAILED DESCRIPTION OF A PREFERRED EMBODIMENT

Figure 1:
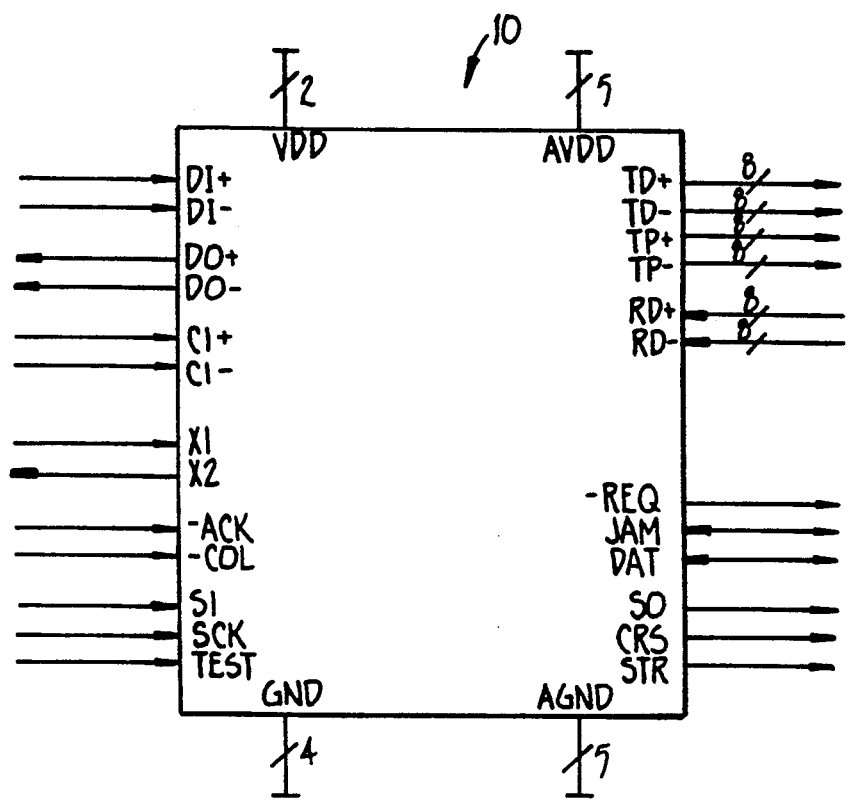
FIG. 1 illustrates one possible pin configuration of an integrated circuit (IC) device 10 embodying the present invention.

FIG. 1 illustrates one possible pin configuration of an integrated circuit (IC) device 10 embodying the present invention. The IC device 10 combines eight medium attachment units (MAUs) and an attachment unit interface (AUI). Each MAU uses one of the lines TD+, TD−, TP+, TP−, RD+ and RD− as disclosed and further explained in the referenced and incorporated pending patent application. The AUI includes the DI+, DI−, DO+, DO−, CI+ and CI− lines as also described in the incorporated patent applications.

The IEEE 802.3 Standard includes a description of a state machine flow specification outlining a minimum set of necessary functions of a repeater. A repeater unit must implement these functions of the IEEE 802.3 Standard. Not shown in FIG. 1 are the state machines of the IC device 10 which implement the repeater functions.

One of these state machines, a partition state machine, controls a reconnection algorithm. The IEEE 802.3 Standard permits and defines a standard reconnection algorithm that reconnects any partitioned port upon successful transmit or receive activity which lasts a minimum of 512 bit times. The IC device 10 of the preferred embodiment of the present invention includes an additional reconnection algorithm, as well as circuitry to select a particular reconnection algorithm for use.

Four signals, serial input (SI), serial output (SO), serial clock (SCK) and test input control (TEST) are part of a test and management control bus. These signals permit control of the reconnection algorithm for the ports. SI is the Test/Management serial input port which permits communication of command and data signals to the IC device 10. SO is the Test/Management serial output port which supplies status data in response to test management commands. Rising edges of a signal on SCK clocks serial data on SI into the IC device 10. Assertion of TEST, active high, causes the IC device 10 to enter a serial scan test mode.

Figure 2:
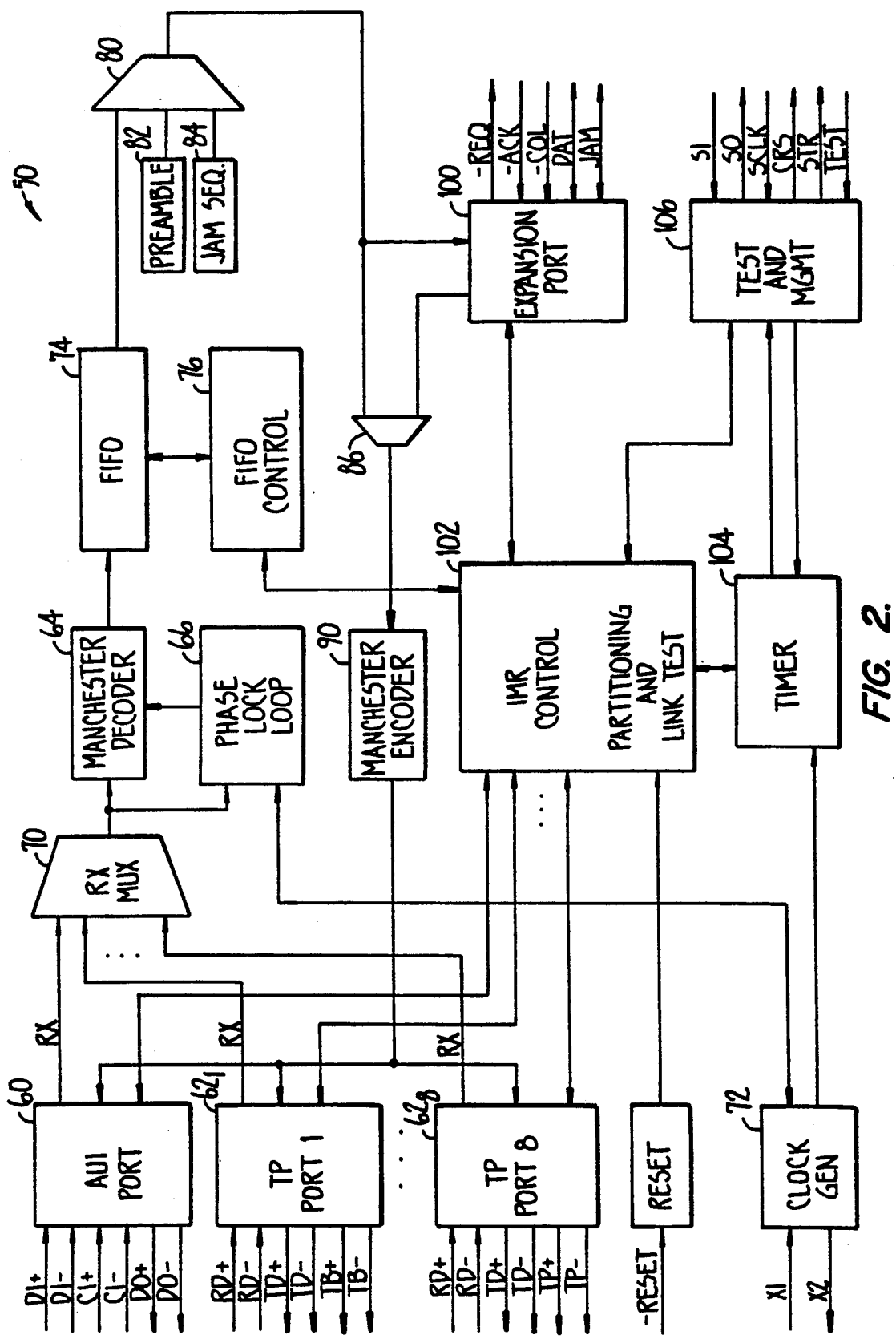
FIG. 2 is a block diagram of an Integrated Multiport Repeater (IMR) 50 embodied for example in IC device 10, according to a preferred embodiment of the present invention.

FIG. 2 is a block diagram of an Integrated Multiport Repeater (IMR) 50 embodied for example in IC device 10 according to a preferred embodiment of the present invention. The IMR 50 includes a plurality of ports. An AUI port 60 and eight twisted pair ports 62$_i$ couple the IMR 50 to a network. The twisted pair ports 62$_1$ conform to the twisted pair draft standard and applicable portions of the IEEE 802.3 Standard Each twisted pair port 62$_i$ operates as a MAU. The twisted pair ports have a line for sending received data (RX) to a decoder 64 and a phase lock loop 66 through a first multiplexer 70. The decoder 64 responds to the phase lock loop 66 for extracting received data by use of an extracted timing clock embedded in the received signal. The phase lock loop 66 uses an independent timing clock received from a clock generator 72. The clock generator 72 responds to an external clocking signal provided at inputs X1 and X2.

A first-in-first-out (FIFO) buffer 74 receives the decoded data from the decoder 64. FIFO control circuitry 76 manages reads from and writes to FIFO buffer 74. IMR 50 not only repeats received data to all its ports, it also conditions the repeated data to be in proper protocol form. Using twisted pair cable allows many types of signal degradations, including timing delays, amplitude distortions and preamble truncations. The repeater strips the incoming data packet of its preamble and substitutes a standard preamble in it place. The repeater retimes and encodes the data with the clock generator 72 to be in proper Manchester form. It is possible that some timing mismatch occurs between the incoming data and the outgoing data because of differences in the clocks. The FIFO buffer 74 provides the necessary elasticity to allow the relatively independent operations of receiving data and repeating the conditioned data. The FIFO buffer 74 comprises one of the inputs into a second multiplexer 80. A preamble circuit 82 and a JAM sequencer 84 are also input into the multiplexer 80. A third multiplexer 86 outputs to an encoder 90. The encoder 90 encodes data received from the third multiplexer 86 and distributes it to the ports for sending to the various nodes. An output of the second multiplexer 80 provides data simultaneously to the third multiplexer 86 and to an expansion port 100. An output of the expansion port also supplies data to the third multiplexer 86. The expansion port 100 includes two bidirectional signals, DAT and JAM. An output signal REQ and two input signals ACK and COL combined with DAT and JAM establish an expansion bus connection.

An IMR control circuit 102 monitors and supervises operation of the IMR 50 in response to various control signals and data. The control circuit 102 contains partitioning and link test circuitry. The control circuit 102 uses various timers from timer circuit 104 and instructions from a test and management port 106 to oversee operation of the ports, the FIFO control circuit 76 and the expansion port 100. Timer circuits 104 are responsive to signals from the clock generator 72 and the test and management port 106.

Figure 3:
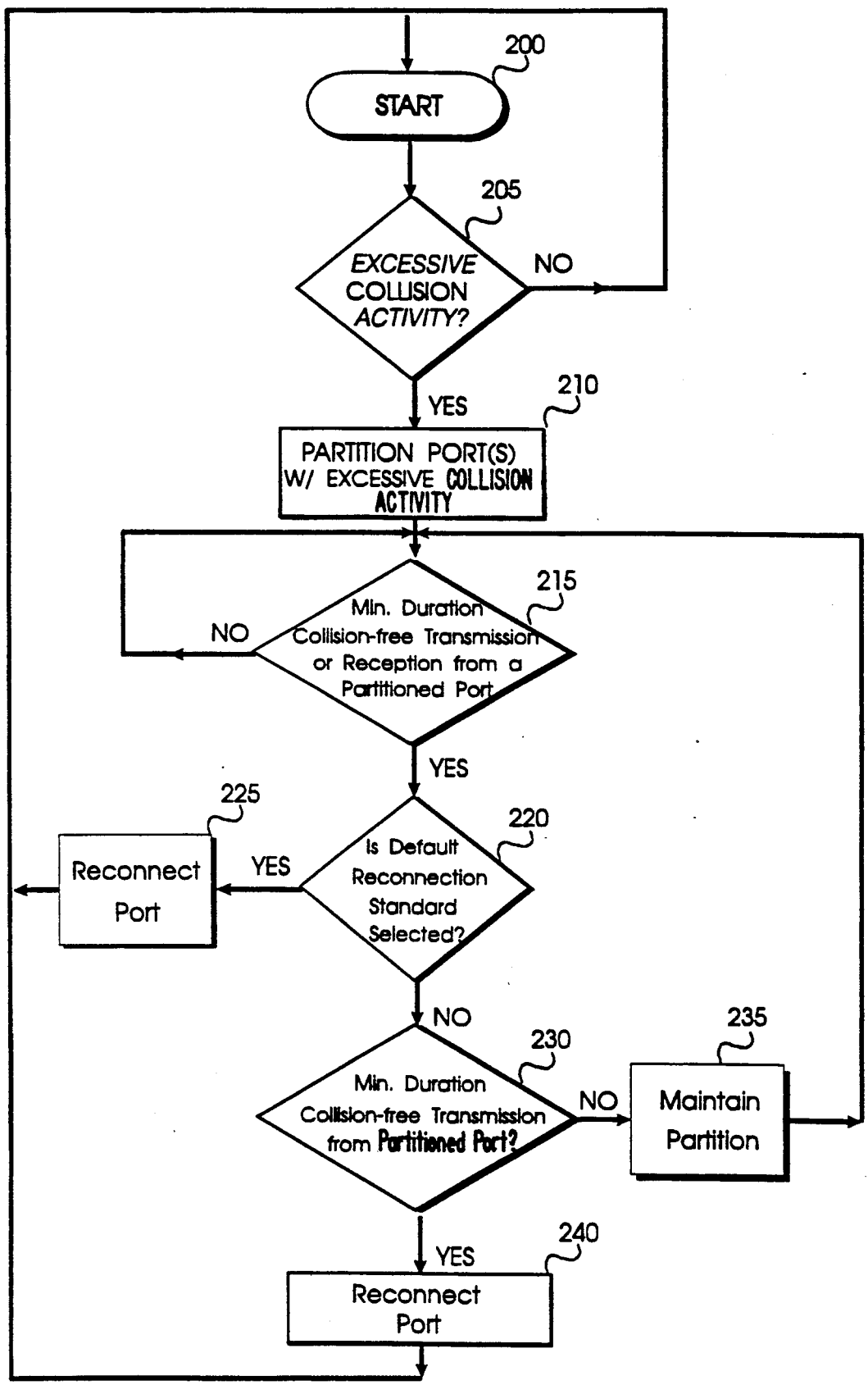
FIG. 3 is an abbreviated flow chart diagramming a preferred state machine process for the IMR 50.
Figures 4, 4A:
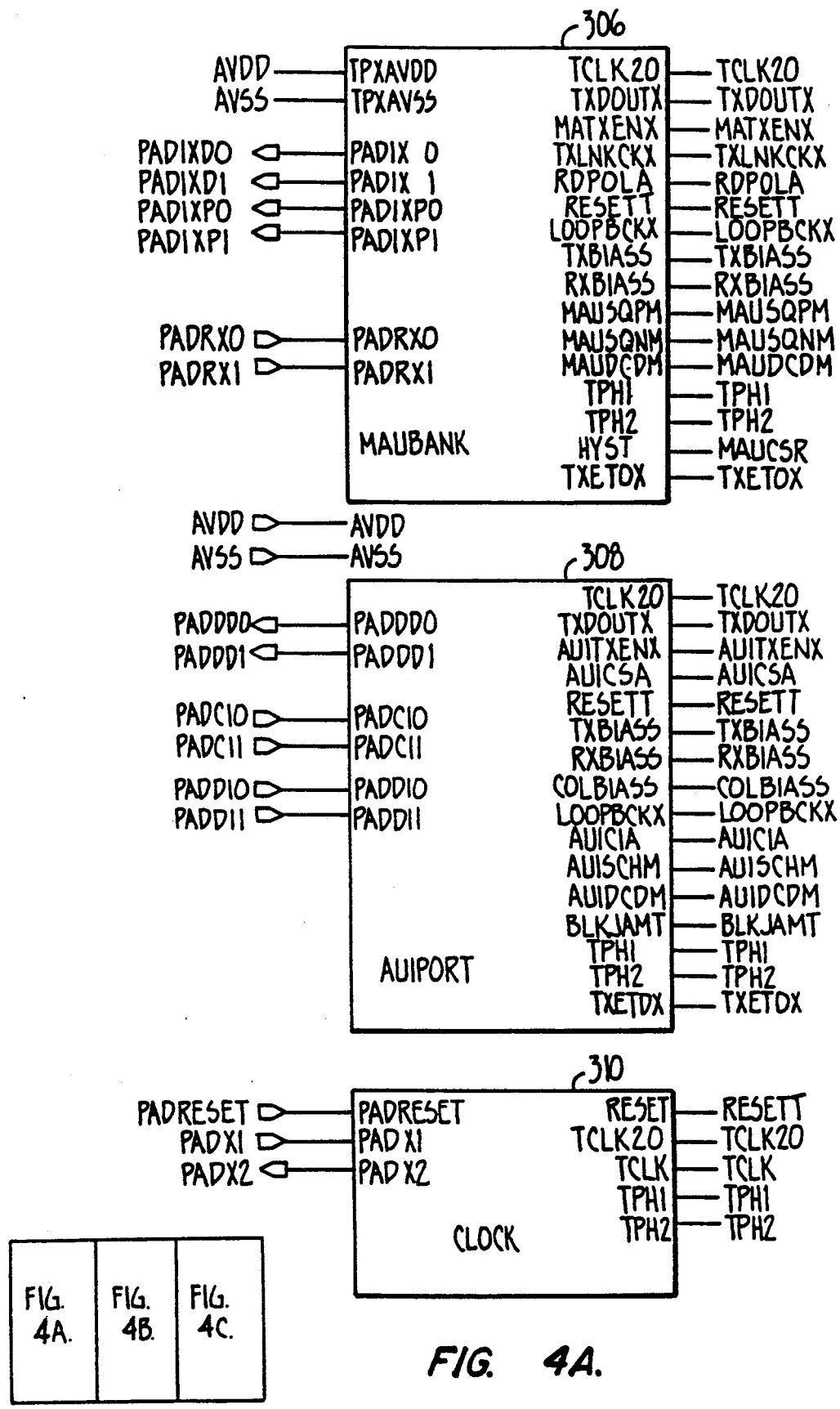
FIGS. 4 and 4(A)–4(C) are a schematic diagram of functional blocks in the IMR 50.
Figure 4B:
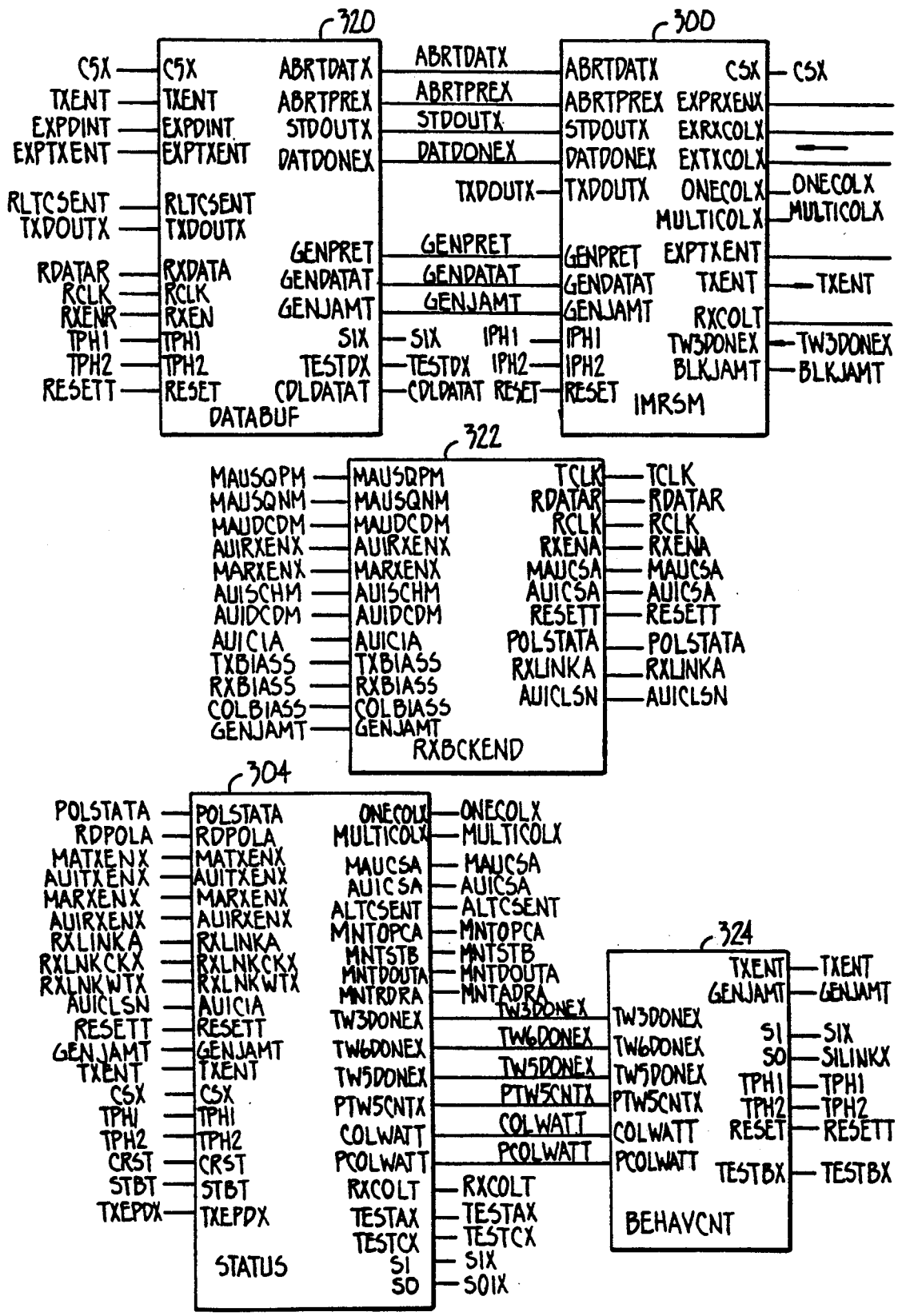
Figure 4C:
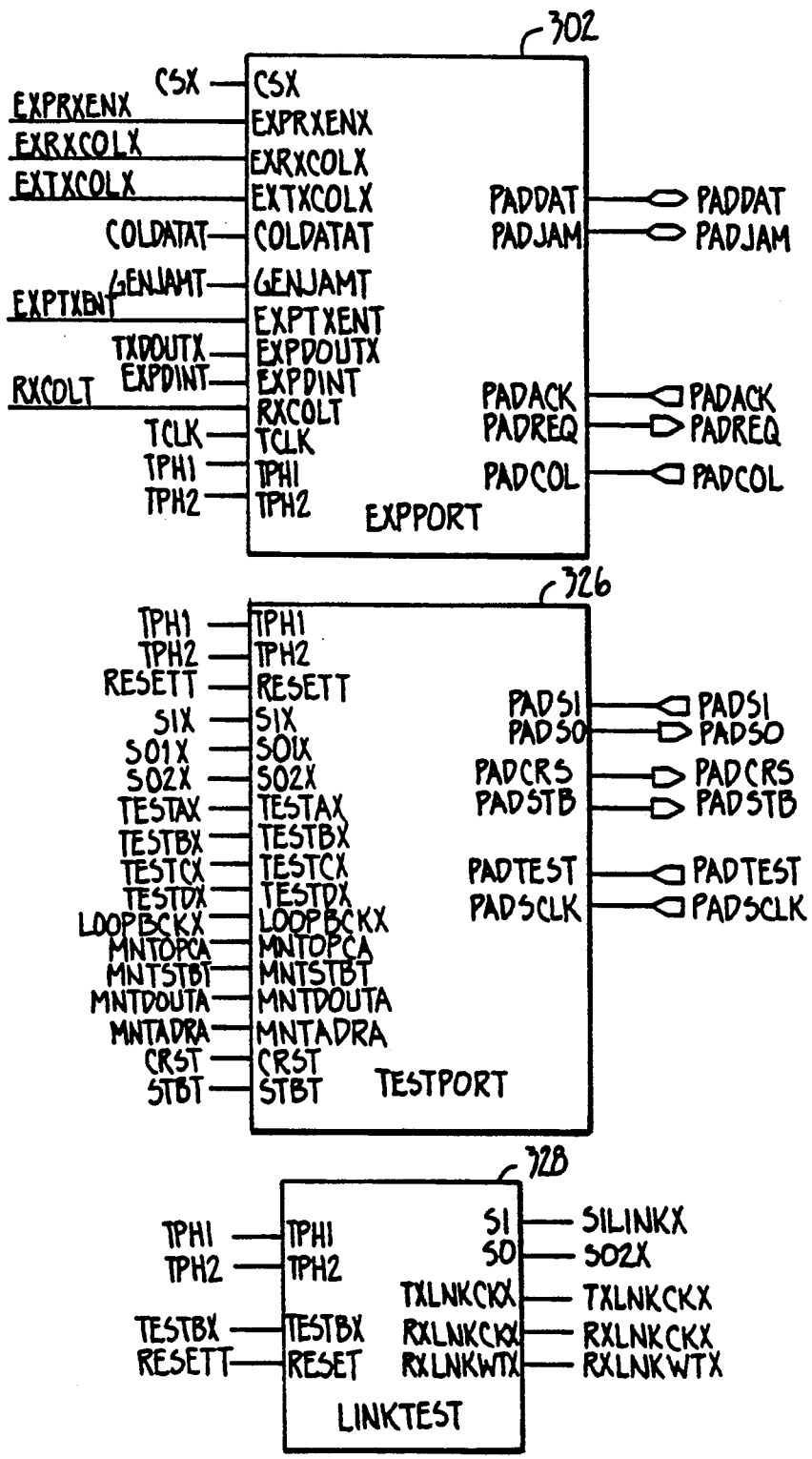

FIG. 3 is an abbreviated flow chart diagramming a preferred state machine partition and reconnection process for the IMR 50.

The process begins at step 200, START. Periodically, the state machine tests for excessive collision activity at a port, step 205. The IEEE 802.3 Standard, section 9.6.6.2, defines excessive collision transmission or reception activity for a particular port as either when a counter indicates completion of a consecutive collision count, or when a single collision duration exceeds a specific amount of time. If the system does not detect any excessive collision activity at a particular port, the process flow returns to step 200. Detection of excessive collision activity directs the process flow to step 210 which partitions ports with excessive collision activity. The IEEE 802.3 Standard associates two states, DataIn and CollIn, with each port. DataIn indicates whether any transmission or reception activity is present at a particular port. Thus, a port which is inactive has DataIn equivalent to an input idle state. CollIn indicates if there is a collision for each port. A port without a collision is said to not have SQE (signal quality error) asserted. A consequence of step 210 partitioning a particular port is that the system forces DataIn for the port to be input idle and CollIn to be no signal quality error. Thus, activity on the port will not affect repeater operation as a review of the repeater state diagram of the IEEE 802.3 Standard illustrates. The system does not block output from the repeater to a segment connected to a partitioned port.

After partitioning, the system continues to operate without interference from the partitioned port. The IEEE 802.3 Standard requires autoconnection of a partitioned port upon the system detecting minimum duration collision-free transmission or reception activity on that port. That is, at step 215, if the system detects collision-free activity for the partitioned port, the process continues to step 220. Collision-free activity which does not reach a threshold value causes the process flow to return to step 215.

Step 220 is a check to determine which reconnection algorithm the system is to use. Selection of the IEEE 802.3 Standard algorithm directs the process flow to step 225 which reconnects the partitioned port and returns the flow to START, step 200. The IEEE 802.3 Standard reconnects a partitioned port upon any type of collision-free, activity, either transmit or receive. As described above with twisted pair wiring, the crosstalk problem manifests itself as a collision caused by transmissions from the repeater. In this case, a particular port may generate a collision every time it transmits. If a partition state machine uses the standard reconnection algorithm, such a defective port will be reconnected upon successful minimum duration collision-free receive activity at the port. Upon being reconnected, transmissions from this port will continuously generate collisions until the state machine partitions the port. The cycle repeats itself, degrading performance of the entire network. Therefore, the partition state machine includes an alternate reconnection algorithm which reconnects a partitioned port only upon minimum duration collision-free transmit only activity. The process flow continues to step 230 from step 220 if the system uses the alternate reconnection algorithm rather than the IEEE 802.3 Standard reconnection algorithm.

At step 230, if the minimum duration collision-free activity detected at step 215 was not only transmission activity from a partitioned port, the state machine maintains the partition, step 235, and thereafter returns to step 215 to await another instance of minimum duration collision-free activity. However, if the activity at step 215 was only transmission activity, process flow moves to step 240 to reconnect the partitioned port. Thereafter, the system returns to START, step 200, to await further instances of excessive collision activity.

FIG. 4 through FIG. 8 are schematic block diagrams of the functional and circuit diagrams implementing the SI commands to an IMR 50 according to a preferred embodiment of the present invention.

FIGS. 4 and 4(A)–4(C) are a schematic diagram of functional blocks in an IMR 50. The IMR 50 includes the IMR state machine 300 receiving and sending signals primarily with respect to an expansion port (EXPPORT) 302 and a status (STATUS) 304 block. The EXPPORT 302 connects the IMR 50 to an expansion bus and includes connections for five expansion bus signals. A MAUBANK 306 and an AUIPORT 308 provide the ports for the IMR 50. A clock 310 function receives the external clock signals from the crystal oscillator 114 and receives any reset signal.

A data buffer (DATABUF) 320 supplies some signals to the IMR state machine 300 as well as the STATUS 304 and the EXPPORT 302. The IMR 50 includes a receiver back end (RXBCKEND) 322 and a behavior counter (BEHAVCNT) 324 which monitors collision duration and jabber function. A test port (TESTPORT) 326 and link test functions (LINKTEST) 328 complete the functional blocks of the IMR 50. An AUISTAT 502 (See FIG. 5) in the STATUS 304 contains an AUICSDET 510 (See FIG. 6) that is responsive to control signals from the TESTPORT 326. The partition state machine is responsive to the test port programming of the AUICSDET 510. The implementation of the control mechanism is one example of controlling selection of a reconnection algorithm for use. In the preferred embodiment, a particular bit pattern, "00010000", clocked into SI by SCK programs the partition state machine to use the alternate reconnection algorithm for all the twisted pair ports. The bit pattern "00011111" selects the alternate reconnection algorithm for the AUI port. The system defaults after a reset to the IEEE 802.3 Standard reconnection algorithm for all the ports. The TESTPORT 326 receives the bit pattern at PADSI and outputs maintenance and test opcodes-asynchronous (MNTOPCDA), maintenance and test addresses-asynchronous (MNTADRA) and maintenance and test strobe (MNTSTBT) to the STATUS 304.

A plurality of timers in the BEHAVCNT 324 influence operation of the partition state machine, as well as collision and activity information developed from the ports, the MAUBANK 306 and the AUIPORT 308. As indicated above, each port continues to operate, in that the repeater transmits to a port and analyzes data received to determine collision status. However, the repeater does not relay information from a partitioned port, nor does it respond to collisions of the port. This operation permits reconnection.

The partition state machine is able to determine collision activity, collision status and alternate partition/reconnection algorithm programming of the ports by use of the MAUCSDET 550 and the AUICSDET 510 in the STATUS 304. Combining this activity and collision information with timing information from the BEHAVCNT 324 implements the partition state machine. An active twisted pair port is a twisted pair port that is either receiving data or transmitting data. An active AUI port is an AUI port for which a data in (DI) circuit senses a carrier signal. The MAUCSDET 550 determines collisions for the twisted pair ports by noting instances when transmit and receive activity for a particular port overlap. For the AUI port, an active collision in (CI) indicates a collision.

Figure 5A:
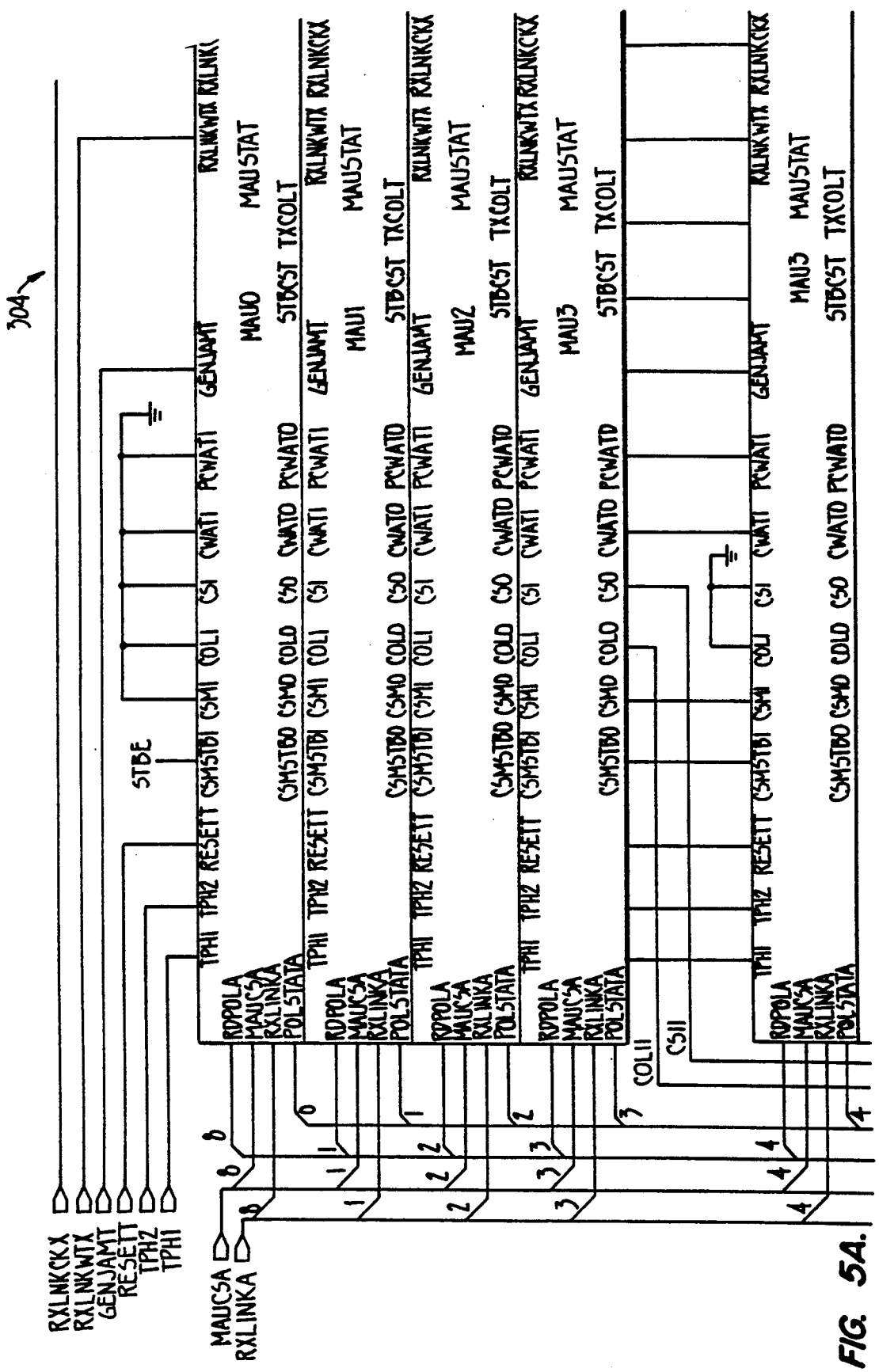
Figure 5C:
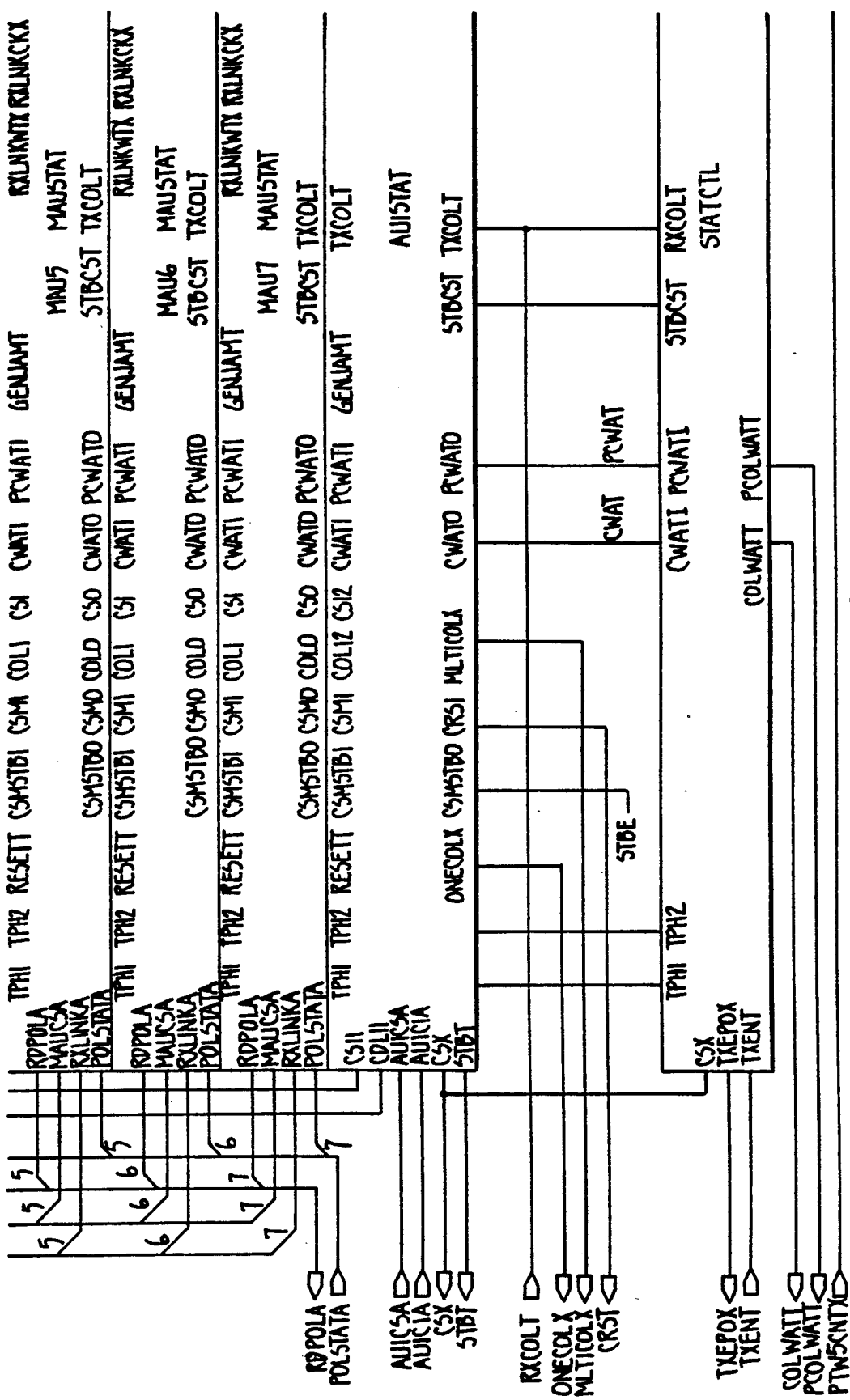
Figure 5D:
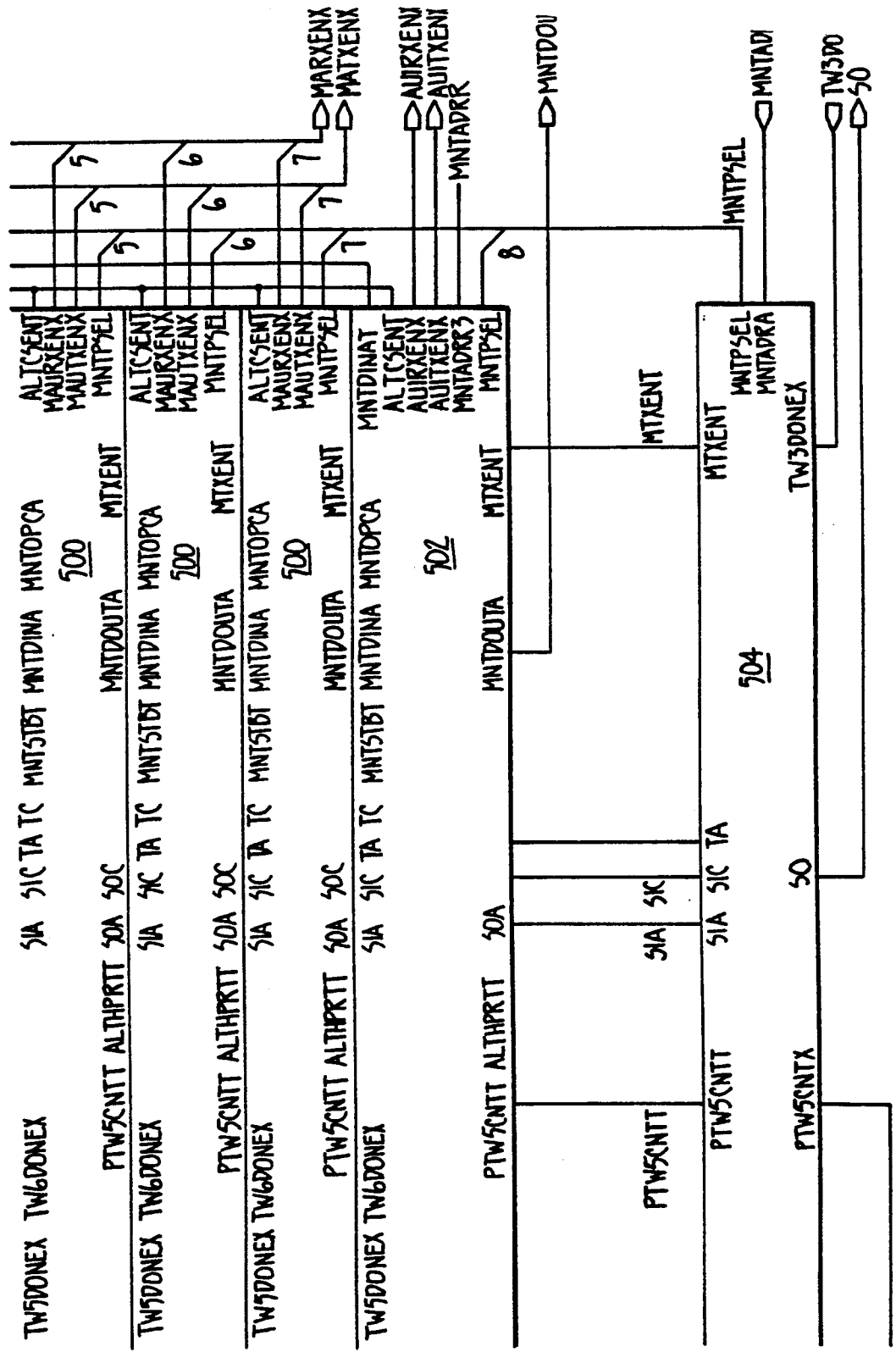

FIGS. 5(A)–5(B) are a detailed block diagram of the STATUS 304. The STATUS 304 operates in relation to the signals from the IMRSM 300 to particularize the IMR for the number and type of ports. The IMRSM 300 is unaware of the particular type of ports and their number. The STATUS 304 block monitors the activities of the individual ports to identify ports which are receiving, and which are transmitting, and the type of data being transmitted. The STATUS 304 also modifies enabling signals directed to the ports to deselect particular ports, for example to disable a transmit enable to a receiving port. The STATUS 304 comprises a MAU status circuit (MAUSTAT) 500 for each MAU port of the IMR 50 and an AUI status circuit (AUISTAT 502) for the AUI port. A status control (STATCTL) 504 controls operation of the MAUSTAT 500 circuits and the AUISTAT 502 circuit. The STATUS 304 receives TXENT, GENJAMT, ALTCSENT, TW3DONEX, RXCOLT, RESETT, TPH1, and TPH2, among other signals. The STATUS 304 produces a plurality of signals, including CSX, ONECOLX and MLTICOLX. A plurality of MAU status (MAUSTAT) circuits 500, one per twisted pair port, provide status information from each port and control information to its associated port. Similarly AUI status (AUISTAT) 502 provides status information and control information concerning the AUI port. A status control (STATCTL) 504 controls operation of the MAUSTAT 500 circuits and the AUISTAT 502.

Figures 6, 6A:
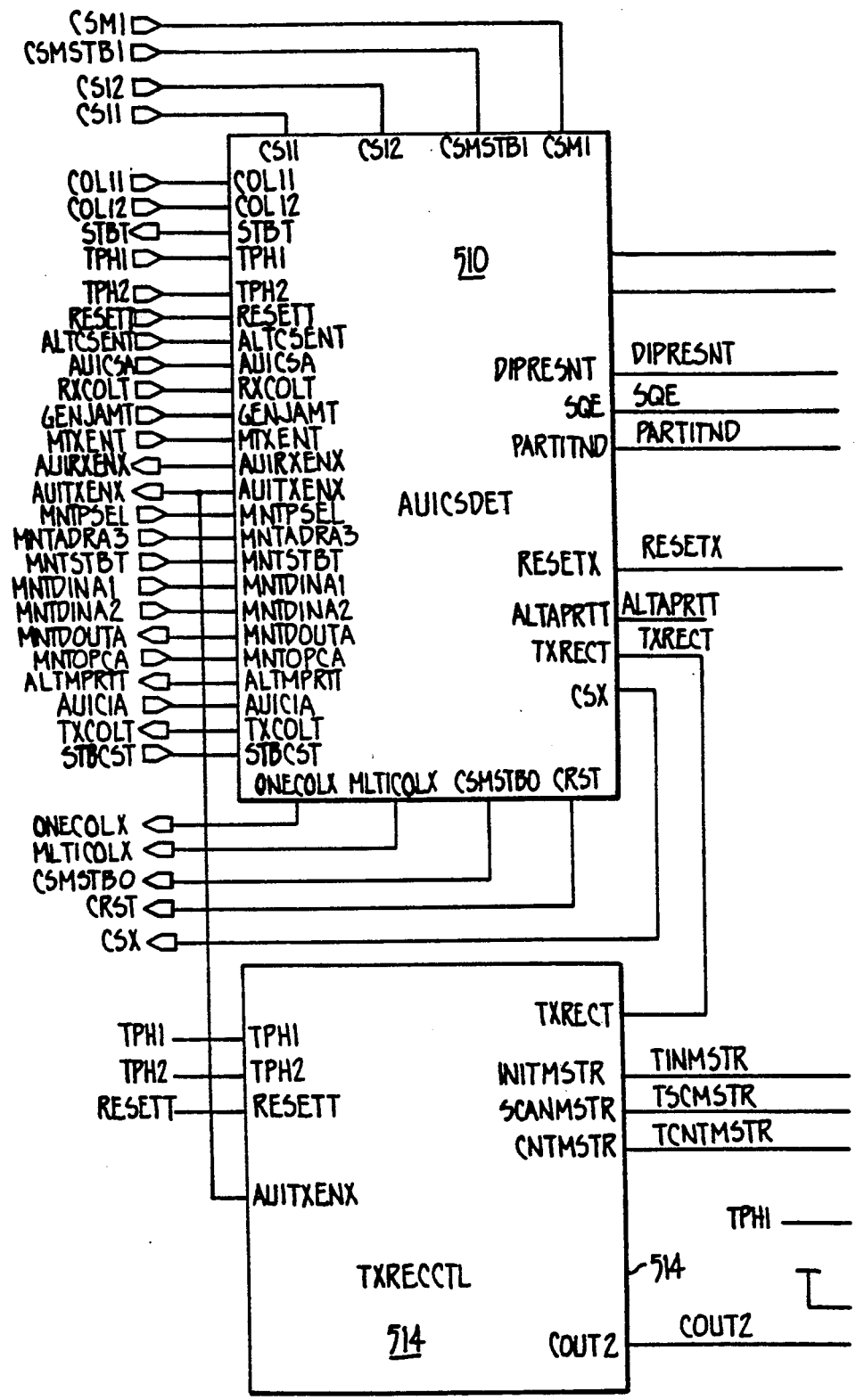
FIGS. 6 and 6(A)–6(B) are a schematic block diagram of an AUISTAT 502 of FIGS. 5(A)–5(B)
Figure 6B:
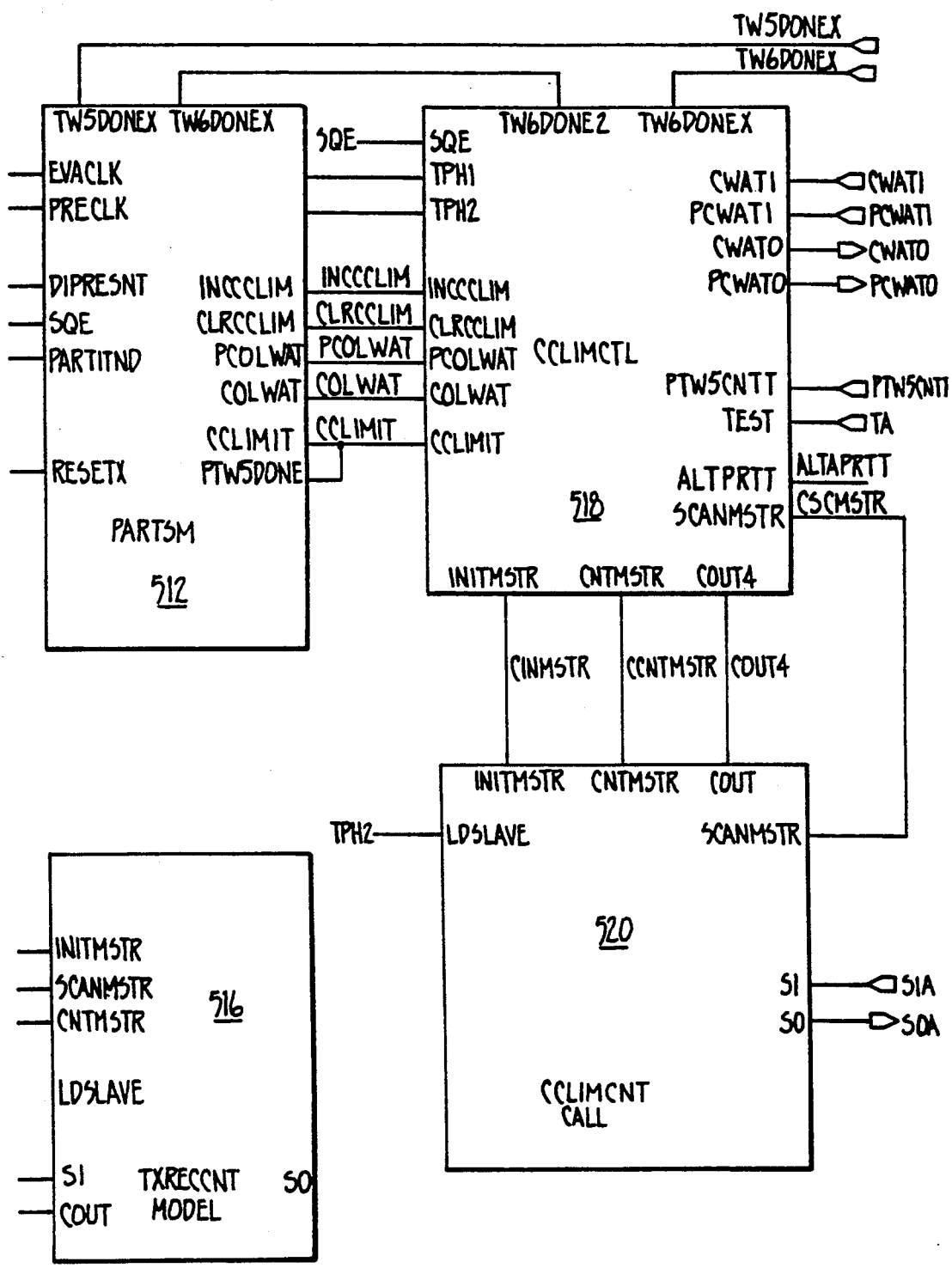

FIGS. 6 and 6(A)–6(B) are a detailed block diagram of the AUISTAT 502 of FIGS. 5(A)–5(D). The AUISTAT 502 includes an AUI carrier sense detector (AUICSDET) 510, a partition state machine (PARTSM) 512, a transmit recovery control (TXRECCTL) 514, a transmit recovery counter (TXRECCNT) 516, a collision count limit control (CCLIMCTL) 518 and a collision count limit counter (CCLIMCNT) 520. The PARTSM 512 performs equivalently to the IEEE 802.3 Standard partition state machine unless a user selects an alternate reconnection algorithm for the PARTSM 512.

Figures 7, 7A:
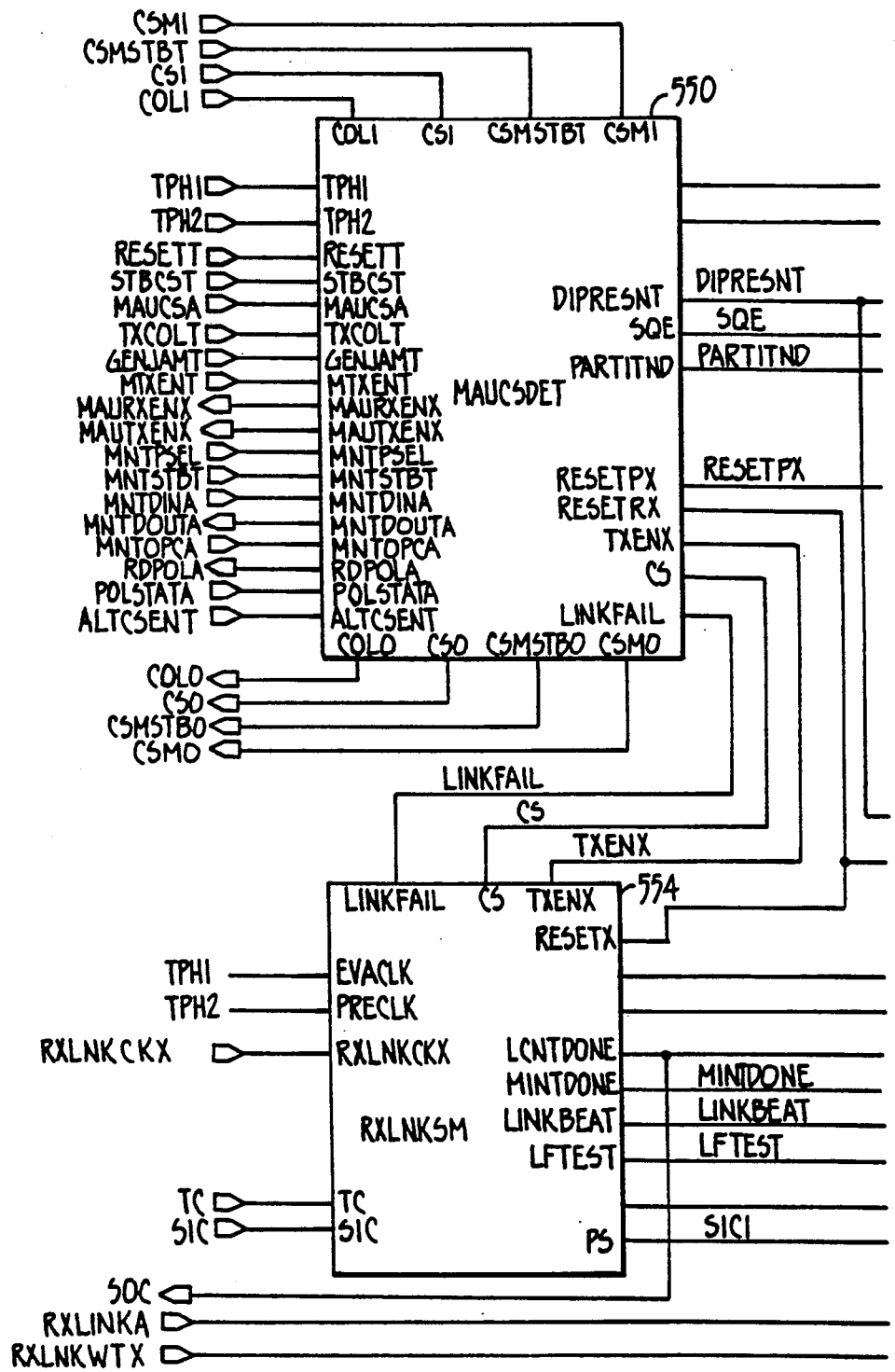
FIGS. 7 and 7(A)–7(B) are a schematic block diagram of an MAUSTAT 500 of FIGS. 5(A)–5(B)
Figure 7B:
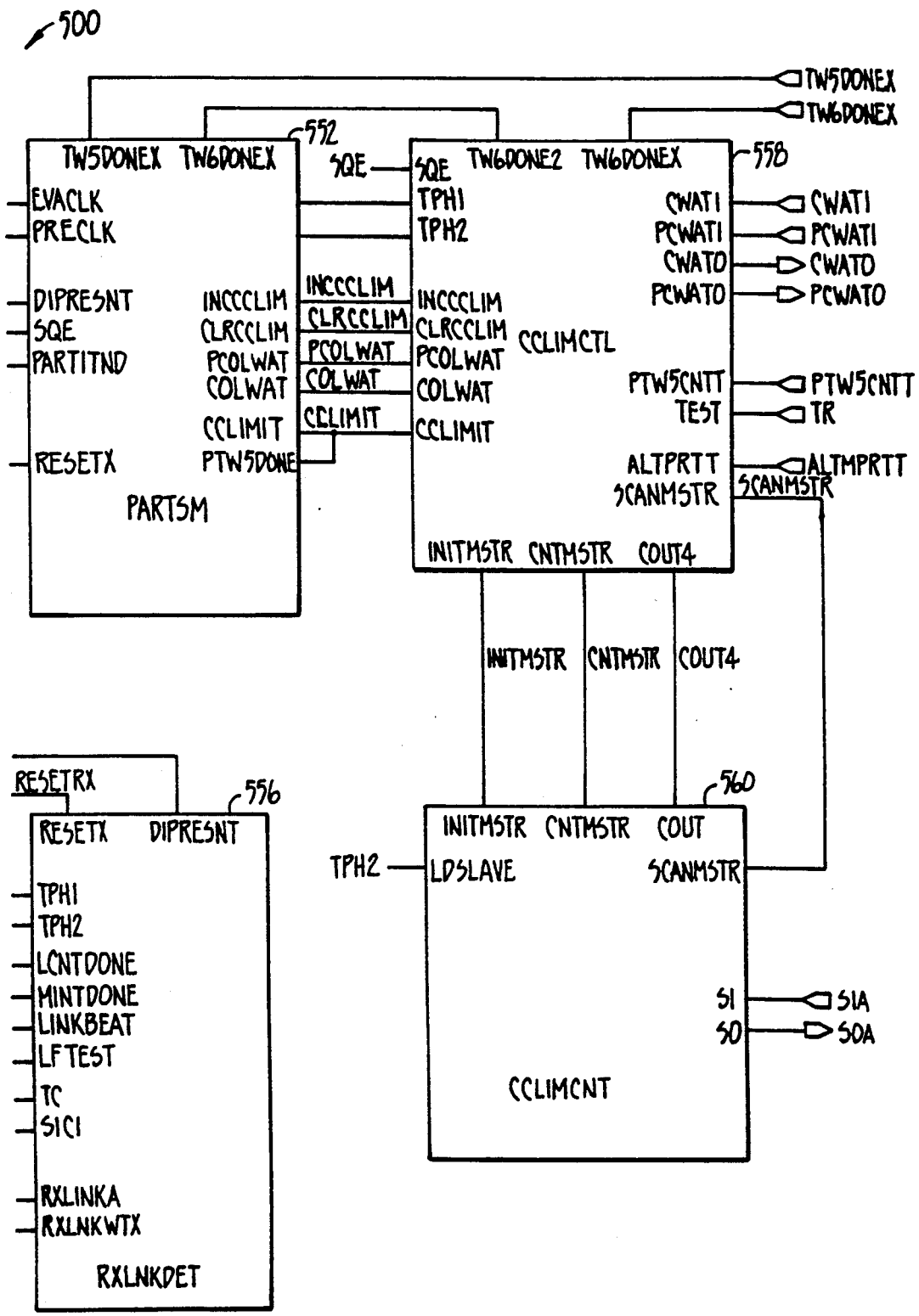
Figure 8B:
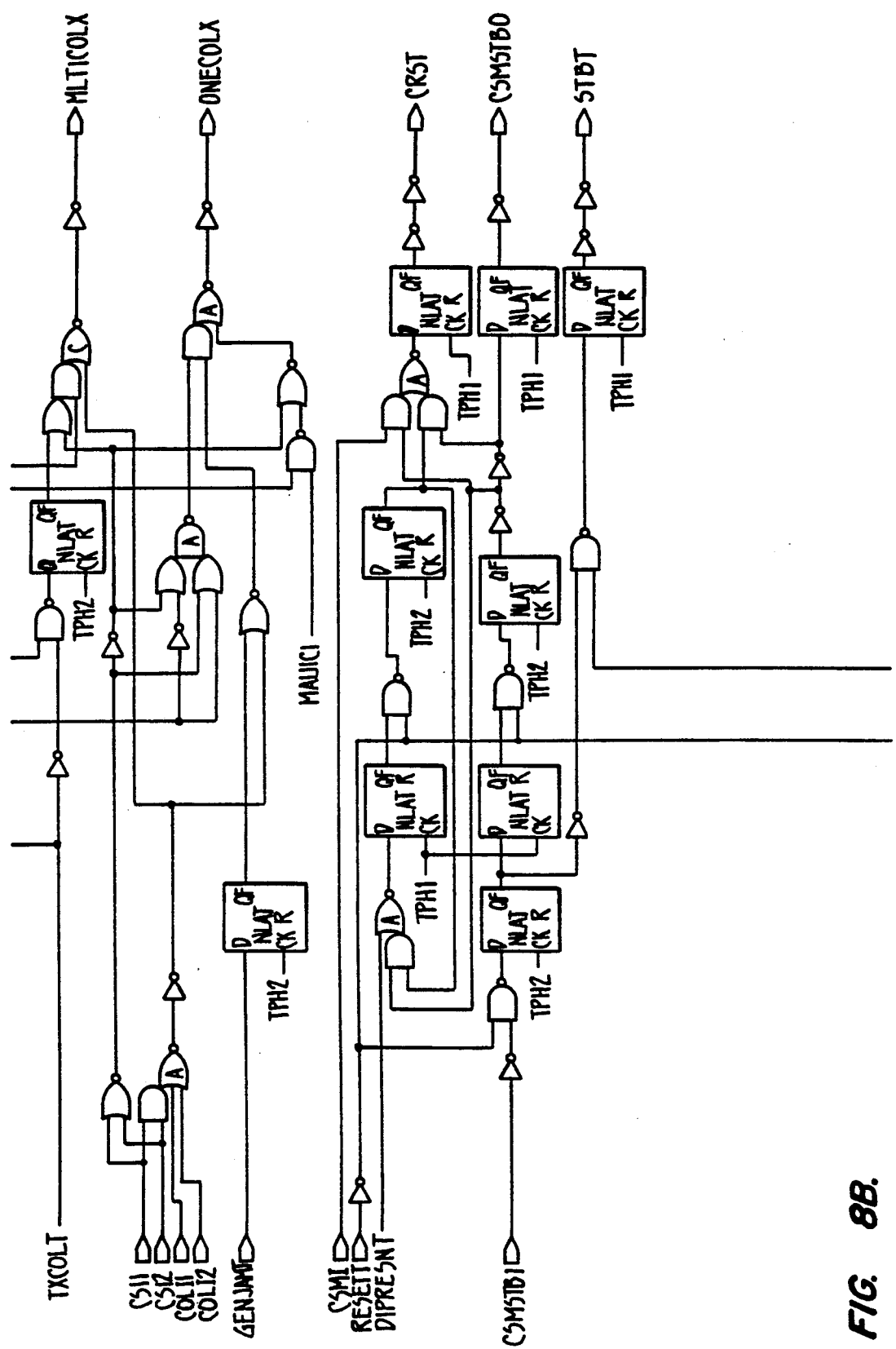
Figure 8C:
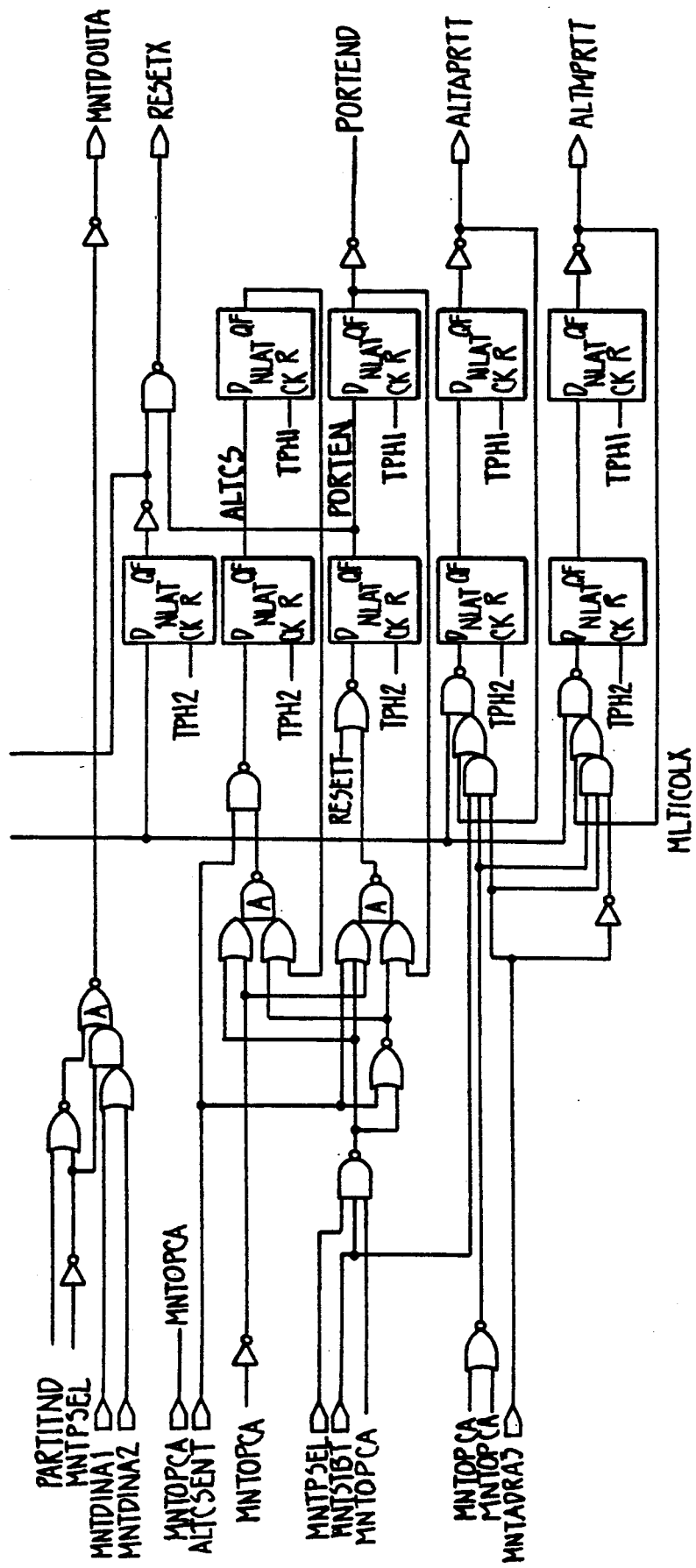

FIGS. 7 and 7(A)–7(B) are a detailed block diagram of the MAUSTAT 500 of FIGS. 5(A)–5(B). The AUISTAT 502 includes an MAU carrier sense detector (MAUCSDET) 550, a partition state machine (PARTSM) 552, a receive link state machine (RXLNKSM) 554, a receive link detector (RXLNKDET) 556, a collision count limit control (CCLIMCTL) 558 and a collision count limit counter (CCLIMCNT) 560. The PARTSM 552 performs equivalently to the IEEE 802.3 Standard partition state machine unless a user selects an alternate reconnection algorithm for the PARTSM 552.

FIGS. 8 and 8(A)–8(C) are a circuit diagram of the AUICSDET 510 of FIGS. 6 and 6(A)–6(B). The present invention uses two signals produced from the AUICSDET 510, namely alternate AUI partition (ALTAPRTT) and alternate MAU port partition (ALTMPRTT). Signals from the TESTPORT 326, namely MNTSTBT, MNTOPCA, and MNTADRA, set ALTAPRTT or ALTMPRTT as appropriate according to an SI clocked into the TESTPORT 326. Assertion of ALTMPRTT indicates that the PARTSM 552 is to use the alternate reconnection algorithm. Assertion of ALTAPRTT indicates that the PARTSM 512 is to use the alternate reconnection algorithm.

A description of the operation of the preferred embodiment of the present invention will be provided by use of FIG. 6 and TABLE I. TABLE I is a written analog of the operation of the PARTSM 512 as well as part of CCLIMCNT 560 and CCLIMCTL 558. TABLE I defines the partition state machine through use of the following syntax:

```
STATE state_name
   IF { condtion } [action ] NEXT state_name;
   ...
   DEFAULT state-name;
   [action ]
   ...
   [action ];
Where,
   state-name:    A symbolic name assigned to a state.
   condition:     A condition which must be TRUE for
                  the state machine to make a transition
                  from a present state to the state
                  symbolically named by the state_name
                  following the key word NEXT.
   action:        An operation (output) performed by the
                  state machine during operation. The
                  state machine performs an identified
                  [action] in two different instances,
                  depending upon where [action] appears
                  in the syntax. For [action] included
                  between an IF {condition} and a NEXT
                  keyword, the identified [action] occurs
                  only if the state machine makes the
                  transition, i.e. the condition is TRUE.
                  For independent [action], the [action]
                  occurs while the state machine is in its
                  present state.
   STATE state_name  specifies the present state of the state
                     machine.
```

| | |
|---|---|
| NEXT state_name | specifies the next state of the state machine. |
| DEFAULT state_name | specifies the next state for the state machine if none of the conditions in any IF statement preceding the DEFAULT statement is satisfied. A DEFAULT present_state_name, where present_state_name is the current state, statement is implicit in any set of syntax not including an explicit DEFAULT statement. |

Additionally, items enclosed in square brackets are optional and independent statements are separated by semicolons. The TABLE I uses the Boolean operators as follows; &=AND, +=OR, and !=NOT.

Specifically, excessive collision activity partitions the AUI port and all the twisted pair ports. For the preferred embodiment, involvement of a port in 32 consecutive collisions or the port having SQE active for more than 1024 bit times results in the partition state machine partitioning the particular port. The particular reconnection algorithm which the partition state machine will use is programmable. Definitions for some of the items used in TABLE I:

| | |
|---|---|
| RX-ACTIVE | TRUE if the particular port is receiving data. |
| TX-ACTIVE | TRUE if the particular port is transmitting data. |
| ACTIVE (AUI) | TRUE if a DI for the port senses Carrier. |
| ACTIVE (TPn) | TRUE if either RX-ACTIVE or TX-ACTIVE is true for twisted pair port n. |
| COLSN (n) | TRUE if there is collision present on port(n). For the twisted pair ports, both transmit and receive circuits are active. For the AUI port, an active CI circuit for the AUI indicates a collision. |
| ALT-REC | TRUE if the partition state machine is to use the alternate reconnection algorithm. |
| Tw5 | A wait timer for length of packet without collision (512 bit times of transmission) |
| Tw6 | A wait timer for excessive length of collision (1024 bit times of transmission) |
| CC | A counter to accumulate a number of consecutive collisions for a particular port. |
| EXCC | A condition checking if CC exceeds a predetermined number, in the preferred embodiment, EXCC is TRUE if CC exceeds 32. |

TABLE I

| | | |
|---|---|---|
| STATE count_clear | | |
| IF {!ACTIVE & !COLSN} | | NEXT collin_count_idle; |
| Reset(CC); | | |
| STATE collin_count_idle | | |
| IF {ACTIVE + COLSN} | Start(Tw5) | NEXT watch_for_collin; |
| STATE watch_for_collin | | |
| IF {!ACTIVE & !COLSN} | | NEXT collin_count_idle; |
| IF {COLSN} | Start(Tw6) | NEXT collin_count_incr; |
| IF {Done(Tw5) & ACTIVE & !COLSN} | | NEXT count_clear; |
| STATE collin_count_incr | | |
| IF {!ACTIVE & !COLSN & !EXCCn & !Done(Tw6)} | | NEXT collin_count_idle; |
| IF {EXCC + Done(Tw6) & COLSN} | | NEXT partition_wait; |
| Increment(CC); | | |
| STATE partition_wait | | |
| IF {!ACTIVE + !COLSN} | | NEXT partition_hold; |
| Partition_this_port; | | |
| STATE partition_hold | | |
| IF {ACTIVE + COLSN} | Start(Tw5) | NEXT partition_collin_watch; |
| Partition_this_port; | | |
| STATE partition_collin_watch | | |
| IF {!ACTIVE & !COLSN} | | NEXT partition_hold; |

TABLE I-continued

```
IF {!ALT-REC & Done(Tw5) & ACTIVE & !COLSN}      NEXT wait_to_restore_port;
IF {ALT-REC & Done(Tw5) & TX-ACTIVE & !COLSN}    NEXT wait_to_restore_port;
IF {COLSN}                                       NEXT partition_wait;
  Partition_this_port;
STATE wait_to_restore_port
  IF {!ACTIVE & !COLSN}                          NEXT collin_count_idle;
  Reset(CC);
  Reconnect_this_port;
```

FIGS. 6 and 6(A)–6(B) and FIGS. 7 and 7(A)–7(B) differ from each other, for purposes of this invention, by the signal, ALTAPRTT or ALTMPRTT, used as an input into the CCLIMCTL 518, or CCLIMTCTL 558. For the MAUSTAT 500, ALTMPRTT inputs into the CCLIMCTL 558, while ALTAPRTT inputs into the CCLIMCTL 518. The present invention is most directly related to a reconnection algorithm of a PARTSM 512 having a partitioned port with the PARTSM 512 deciding if it can reconnect the partitioned port. Therefore, most of the following discussion will concentrate on the partition_collision_watch state in which the PARTSM 512 makes the decision to reconnect a particular partitioned port.

Transition of the PARTSM 512 into the partition_collision_watch state from a partition_hold state occurs upon assertion of ACTIVITY or COLSN. The PARTSM 512 detects ACTIVITY by an assertion of DIPRESNT from the AUICSDET 510. Detection of COLSN by the PARTSM 512 occurs subsequent assertion of signal quality error (SQE) from the AUICSDSET 510. The transition to the partition_collision_watch state starts a wait timer Tw5. The Tw5 wait timer's function is to establish transmission of a minimum packet length without a collision. The IEEE 802.3 Standard requires that this value be between 450 and 560 bit times, with the preferred embodiment of the present invention using 512 bit times for the Tw5 limit.

The PARTSM 512 in the partition_collision_watch state first tests to determine if the port is IDLE (not ACTIVE or not in COLSN). If the port is IDLE, the PARTSM 512 transitions back to the partition_hold state. If the PARTSM 512 is not IDLE, the PARTSM 512 tests to determine whether to reconnect the partitioned port. The first test, the default IEEE 802.3 Standard reconnection algorithm, initiates reconnection of the partitioned port if the Tw5 wait timer expired (minimum 512 bit times of transmission) with port activity and without a collision. The PARTSM 512 monitors DIPRESNT to establish the logical value of ACTIVITY and it monitors SQE to establish the logical value of COLSN. The BEHAVCNT 324 signals the expiration of the Tw5 wait timer by asserting TW5DONEX. TW5DONEX is a synchronized transmission asserted after the repeater transmits 512 bit times of a data. The signal PTW5DONE from the CCLIMCTL 518 monitors receptions from the port without a collision. The CCLIMCTL is a 5 bit counter which counts every 16th clock on PTW5CNTT. The BEHAVCNT 324 asserts PTW5CNTT upon every 16th clock of receive activity. Additionally, the PARTSM 512 asserts clear collision counter limit (CLRCCLIM) whenever a collision occurs, which clears an accumulation of counts towards the 512 limit.

The CCLIMCTL 518 serves two uses. The first use is counting consecutive collisions (1 count/collision) to establish an excessive collision condition for a port. The second use is to determine when to reconnect a port based upon receiving without collision. This dual use requires less hardware than including a separate counter for each use. Since the consecutive count is only to 32, a 5 bit counter is acceptable. Thus, for the IEEE 802.3 Standard reconnection algorithm, the PARTSM monitors PTW5DONE, DIPRESNT, TW5DONEX and SQE. The PARTSM 512 reconnects the port if DIPRESNT remains asserted, without an SQE assertion, long enough for CCLIMCTL 518 to assert PTW5DONE Assertion of SQE clears CCLIMCTL 518, restarting the timer after the system goes IDLE.

If the repeater is using the alternate reconnection algorithm, ALTAPRTT is TRUE. The PARTSM 512 using the alternate reconnection algorithm reconnects a partitioned port if the port only successfully transmits for the duration of the Tw5 timer. The PARTSM 512 and the CCLIMCTL use the same operation as described above except that the AUICSDET 510 asserts ALTAPRTT to the CCLIMCTL 518. Assertion of ALTAPRTT to the CCLIMCTL results in the CCLIMCTL ignoring receive clock pulses on the PTW5CNTT. With ALTAPRTT asserted, the CCLIMCTL 518 is unable to assert PTW5DONE upon 512 bit times of collision free reception from the port. The port may still be reconnected upon 512 bit times of collision free transmission based on TW5DONEX.

As described above, the PARTSM 512 is programmable to select either the IEEE 802.3 Standard reconnection algorithm or an alternate reconnection algorithm which reconnects a partitioned port only upon successful transmission from a partitioned port.

Figures 9, 9A:
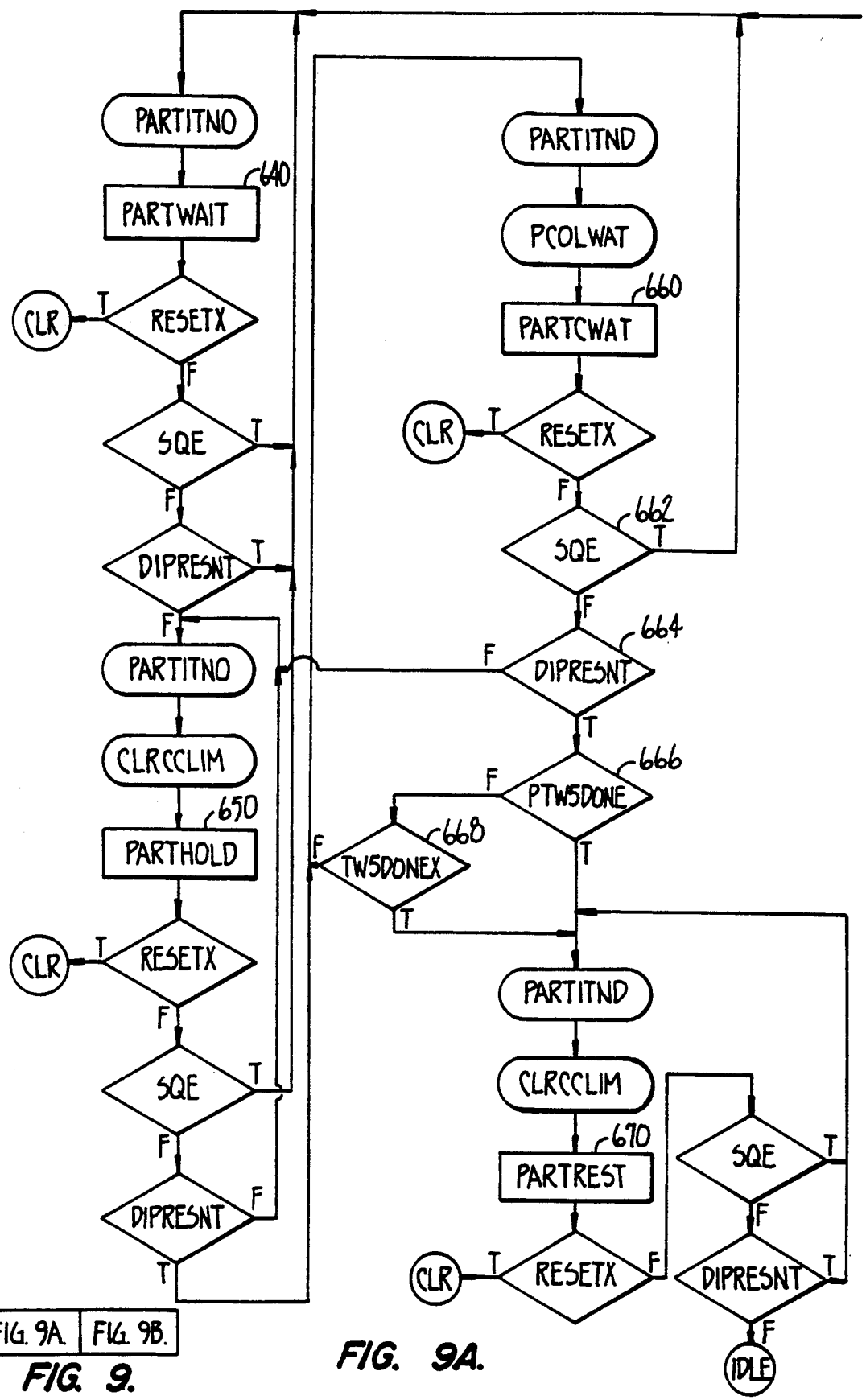
FIGS. 9 and 9(A)–9(B) are a partition state diagram for the PARTDM 512 or the PARTSM 552.
Figure 9B:
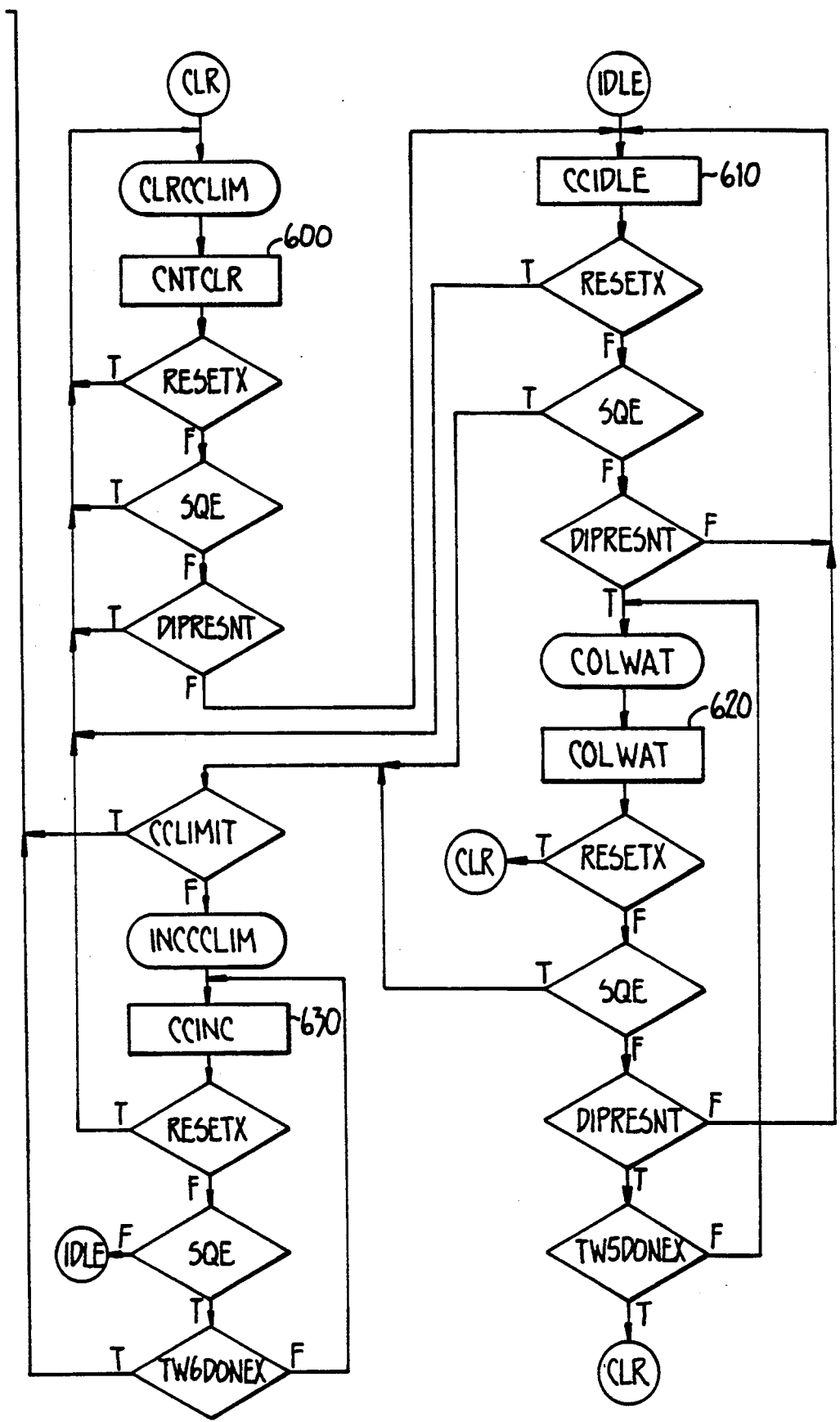

FIGS. 9 and 9(A)–9(B) are a partition state diagram for the PARTSM 512 or the PARTSM 552. The partition state diagram specifies eight states; count_clear (CNTCLR) 600, collision_count_idle (CCIDLE) 610, collision_watch (COLWAT) 620, collision_count_increment (CCINC) 630, partition_watch (PARTWAT) 640, partition_hold (PARTHOLD) 650, partition_collision_watch (PARTCWAT) 660, and partition_restore (PARTREST) 670. These states correspond to the states of TABLE I. Sequences and transitions in the flow chart of FIG. 9 define operation of the PARTSM 512 by use of input and output signals presented in FIG. 7. The reconnection algorithm is associated with the steps 662 through 668. The PARTSM 512 is transparent to the particular algorithm selected because it responds to assertions of SQE, DIPRESNT, PTW5DONE, and TW5DONEX. The type of reconnection algorithm selected by an assertion or negation of ALTAPRTT (or ALTMPRTT for the PARTSM 552) effects the CCLIMCTL 518 (CCLIMCTL 558 for the MAU ports) to control whether the CCLIMCTL 518 responds to PTW5CNTT.

In conclusion, the present invention provides programmable control over a novel reconnection algorithm for use in repeaters. The alternate reconnection algorithm allows for a robust methodology for improving a network efficiency which is degraded by employing the IEEE 802.3 Standard reconnection algorithm. While the above is a complete description of the preferred embodiments of the present invention, various alternatives, modifications, and equivalents to these preferred embodiments are possible. Therefore, the above description does not limit the scope of the present invention. The appended claims define this scope and set forth the metes and bounds of the invention.

What is claimed is:

1. A method for reconnecting a partitioned port in a repeater having a plurality of ports, comprising the steps of:
   detecting excessive collision activity for a particular one port of the plurality of ports;
   partitioning said particular one port;
   checking for lack of data collisions only during transmissions from said particular one port; and
   reconnecting said particular one port only when said particular one port transmits collision-free for a predetermined time period.

2. A partitioning selection and reconnection process for a repeater having a plurality of ports, comprising the steps of:
   providing the repeater with a first and a second reconnection procedure, said first reconnection procedure reconnecting a partitioned port if said partitioned port receives or transmits collision-free for a predetermined time period and said second reconnection procedure reconnecting a partitioned port only if said partitioned port transmits collision-free for a predetermined time period;
   selecting a particular one reconnection procedure of said first and second reconnection procedures for a particular port;
   detecting excessive collision activity for said particular port;
   partitioning said particular port;
   checking for a lack of collisions during a particular type of port activity appropriate for said particular one reconnection procedure; and
   reconnecting said particular port upon satisfaction of said selected particular one reconnection procedure.

3. A repeater for a network, comprising:
   a data port, for transmitting and receiving data packets;
   means, coupled to said data port, for detecting excessive collision activity;
   means, coupled to said detecting means, for partitioning said data port upon detection of excessive collision activity to form a partitioned data port;
   means, coupled to said detecting means, for checking for an absence of a data collision only during transmissions from said partitioned data port; and
   means, coupled to said detecting means, for reconnecting said partitioned data port when said partitioned data port transmits collision-free for a predetermined time period.

4. A method for reconnecting a partitioned repeater port, comprising the steps of:
   equipping a repeater with a set of reconnection procedures wherein said set of reconnection procedures includes a first and a second reconnection procedure;
   selecting a particular one reconnection procedure from said set of reconnection procedures for a particular partitioned port of the repeater;
   checking said particular partitioned port for an absence of collisions during port activity of said particular partitioned port; and
   reconnecting said particular partitioned port by use of said particular one reconnection procedure.

5. The reconnecting method of claim 4 wherein said reconnecting step further comprises the steps of:
   reconnecting said particular partitioned port upon a partition state machine of said repeater detecting minimum duration collision-free activity from said particular partitioned port when said first reconnection procedure has been selected from said set of reconnection procedures, and otherwise;
   reconnecting said particular partitioned port upon a partition state machine of said repeater detecting minimum duration collision-free transmission activity from said particular partitioned port when said second reconnection procedure has been selected from said set of reconnection procedures.

6. A method for reconnecting a partitioned port of a repeater having a plurality of ports, comprising the steps of:
   checking for a lack of a data collision only during transmissions from the partitioned port; and
   reconnecting the partitioned port when the partitioned port transmits collision-free for a predetermined number of transmissions.

7. A method for reconnecting a partitioned port of a repeater having a plurality of ports, comprising the steps of:
   providing a set of reconnection procedures for the repeater wherein said set of reconnection procedures includes a first and a second reconnection procedure;
   selecting a particular one reconnection procedure from said set of reconnection procedures for the partitioned port;
   checking for an absence of a data collision relative to the partitioned port during both transmission and reception activity of the partitioned port; and
   reconnecting the partitioned port when said particular one reconnection procedure is satisfied.

8. The reconnecting method of claim 7 wherein said reconnecting step further comprises the steps of:
   reconnecting the partitioned port when the partitioned port either transmits or receives collision-free for a prespecified interval when said first reconnection procedure has been selected, and otherwise;
   reconnecting the partitioned port only when the partitioned port transmits collision-free for a prespecified interval when said reconnection procedure has been selected.

9. A network system, comprising:
   a first node, for transmitting a first data packet;
   a second node, for receiving said first data packet;
   a repeater, coupled to said first node and said second node, for transmitting said first data packet from said first node to said second node, said repeater coupled to said first node at a data port, the repeater comprising:
   a detector, coupled to said data port, for detecting excessive collision activity;
   a partition circuit, coupled to said detector circuit, for partitioning said data port upon detection of excessive collision activity in said first node, to form a partitioned data port;
   a checking circuit, coupled to said detector, for checking for an absence of data collisions during only transmissions from said partitioned data port; and
   a reconnection circuit, coupled to said detector, for reconnecting said partitioned data port when said partitioned data port transmits collision-free for a predetermined time period.

* * * * *